(12) United States Patent
Akselrod et al.

(10) Patent No.: US 10,968,522 B2
(45) Date of Patent: Apr. 6, 2021

(54) FABRICATION OF METALLIC OPTICAL METASURFACES

(71) Applicants: Gleb M. Akselrod, Bellevue, WA (US); Erik Edward Josberger, Seattle, WA (US); Mark C. Weidman, Bellevue, WA (US)

(72) Inventors: Gleb M. Akselrod, Bellevue, WA (US); Erik Edward Josberger, Seattle, WA (US); Mark C. Weidman, Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 355 days.

(21) Appl. No.: 15/943,350

(22) Filed: Apr. 2, 2018

(65) Prior Publication Data
US 2019/0301025 A1    Oct. 3, 2019

(51) Int. Cl.
*C25D 3/38*         (2006.01)
*G03H 1/02*         (2006.01)
(Continued)

(52) U.S. Cl.
CPC .......... *C23C 28/322* (2013.01); *C23C 14/021* (2013.01); *C23C 14/185* (2013.01); *C23C 14/34* (2013.01); *C23C 28/34* (2013.01); *C25D 3/38* (2013.01); *C25D 5/02* (2013.01); *C25D 5/34* (2013.01); *C25D 5/48* (2013.01);
(Continued)

(58) Field of Classification Search
None
See application file for complete search history.

(56) References Cited

U.S. PATENT DOCUMENTS

2001/0028483 A1    10/2001  Buse
2001/0030725 A1    10/2001  Shinohara et al.
(Continued)

FOREIGN PATENT DOCUMENTS

CN         103259097 A        8/2013

OTHER PUBLICATIONS

Chen et al. "Plating Uniformity of Bottom-up Copper Pillars and Patterns for IC Substrates with Additive-assisted Electrodeposition", Electrochimica Acta, 120, 2014, 293-301. (Year: 2014).*
(Continued)

*Primary Examiner* — Stefanie S Wittenberg

(57) ABSTRACT

The disclosure provides a method for fabricating a metallic optical metasurface having an array of hologram elements. The method includes forming a first copper layer protected with a conducting or dielectric barrier layer over a backplane structure by a damascene process. The first copper layer comprises a plurality of nano-gaps vertically extending from the backplane structure. The plurality of nano-gaps is filled with a dielectric material. The method also includes removing the dielectric material and a portion of the conducting or dielectric barrier layer to expose the portions in the nano-gaps of the first copper layer. The method may further include depositing a dielectric coating layer over the top portion and exposed side portions of the first copper layer to form a protected first copper layer, and filling the gaps with an electrically-tunable dielectric material that has an electrically-tunable refractive index.

23 Claims, 9 Drawing Sheets

(51) Int. Cl.
  *C23C 28/00* (2006.01)
  *C25D 5/02* (2006.01)
  *C25D 5/34* (2006.01)
  *C23C 14/34* (2006.01)
  *C23C 14/18* (2006.01)
  *C23C 14/02* (2006.01)
  *C25D 5/48* (2006.01)

(52) U.S. Cl.
  CPC ........... *G03H 1/02* (2013.01); *G03H 2240/21* (2013.01); *G03H 2260/62* (2013.01)

(56) References Cited

U.S. PATENT DOCUMENTS

| | | |
|---|---|---|
| 2005/0247866 A1 | 11/2005 | Plewa |
| 2008/0008472 A1 | 1/2008 | Dress et al. |
| 2008/0128774 A1 | 6/2008 | Irani |
| 2009/0169866 A1 | 7/2009 | Ostafin |
| 2010/0075262 A1 | 3/2010 | Koefer |
| 2010/0276665 A1 | 11/2010 | Wang |
| 2011/0193106 A1 | 8/2011 | Lerman et al. |
| 2012/0194399 A1 | 8/2012 | Bily et al. |
| 2013/0320344 A1* | 12/2013 | Kim ................. H01L 29/78693 257/57 |
| 2014/0252390 A1* | 9/2014 | Yoon .................... H01L 33/405 257/98 |
| 2014/0266946 A1 | 9/2014 | Bily et al. |
| 2015/0162658 A1 | 6/2015 | Bowers et al. |
| 2015/0318618 A1 | 11/2015 | Chen et al. |
| 2015/0318620 A1 | 11/2015 | Black et al. |
| 2015/0372389 A1 | 12/2015 | Chen et al. |
| 2015/0380828 A1 | 12/2015 | Black et al. |
| 2016/0028002 A1* | 1/2016 | Tortorelli ............ H01L 45/1683 257/4 |
| 2016/0303879 A1 | 10/2016 | Yamada |
| 2016/0320531 A1 | 11/2016 | Kamali |
| 2016/0370568 A1 | 12/2016 | Toussaint |
| 2017/0047312 A1 | 2/2017 | Budd et al. |
| 2017/0171540 A1 | 6/2017 | Li |
| 2017/0212285 A1 | 7/2017 | Arbabi |
| 2018/0239213 A1 | 8/2018 | Akselrod |

OTHER PUBLICATIONS

PCT International Search Report; International App. No. PCT/US2019/025172; dated Jul. 18, 2019; pp. 1-4.
Komar et al.; "Dynamic Beam Switching by Liquid Crystal Tunable Dielectric Metasurfaces"; ACS Photonics; 2018; pp. 1742-1748; vol. 5; American Chemical Society.
PCT International Search Report; International App. No. PCT/US2018/019036; dated Jun. 11, 2018; pp. 1-3.
Arbabi et al.; Dielectric Metasurfaces for Complete Control of Phase and Polarization with Subwavelength Spatial Resolution and High Transmission; Nature Nanotechnology; Aug. 31, 2015; pp. 937-943; vol. 10; Macmillan Publishers Limited.
PCT International Search Report; International App. No. PCT/US2018/019269; dated Jun. 4, 2018; pp. 1-4.
Y. Huang et al., "Gate-tunable Conducting Oxide Metasurfaces," Nano Letter 16, 5319 (2016).
A. Pors, S.I. Bozhevolnyi, "Plasmonic Metasurfaces for Efficient Phase Control in Reflection," Opt. Express 21, 27438 (2013).
Arbabi et al., "Subwavelength-thick Lenses with High Numerical Apertures and Large Efficiency Based on High Contrast Transmitarrays," Nat. Commun. 6, 1 (2014).
C. Haffner et al., "All-plasmonic Mach-Zehnder Modulator Enabling Optical High-Speed Communication at the Microscale," Nat. Photonics 9, 525-528 (2015).
M. Li et al., "Poling Efficiency Enhancement of Tethered Binary Nonlinear Optical Chromophores for Achieving an Ultrahigh n3r33 Figure-of-Merit of 2601 pm V?1" J. Mater. Chem. C3, 6737-6744 (2015).
X. Zhang et al., "High Performance Optical Modulator Based on Electro-optic Polymer Filled Silicon Slot Photonic Crystal Waveguide," J. Light. Technol. 34, 2941-2951 (2016).
Y. Xing et al., "Digitally Controlled Phase Shifter Using an SOI Slot Waveguide with Liquid Crystal Infiltration," 27, 1269-1272 (2015).
Borshch, S.V. Shiyanovskii et al., "Nanosecond Electro-optic Switching of a Liquid Crystal," Phys. Rev. Lett. 111, 107802 (2013).
H. Chen et al., "Ultra-low Viscosity Liquid Crystal Materials," Opt. Mater. Express 5, 655 (2015).
B. Gholipour et al., "An All-optical, Non-Volatile, Bidirectional, Phase-Change Meta-Switch," Adv. Mater 25, 3050 (2013).
S. Raoux et al., "Phase Change Materials and Phase Change Memory," MRS Bull, 39, 703 (2014).
C. Rios et al., "Integrated All-Photonic Non-Volatile Multi-level Memory," Nat. Photonics 9, 725 (2015).
Arbabi et al.; Dielectric Metasurfaces for Complete Control of Phase and Polarization with Subwavelength Spatial Resolution and High Transmission; Nature Nanotechnology; 2015; pp. 1-9; Macmillan Publishers Limited.

\* cited by examiner

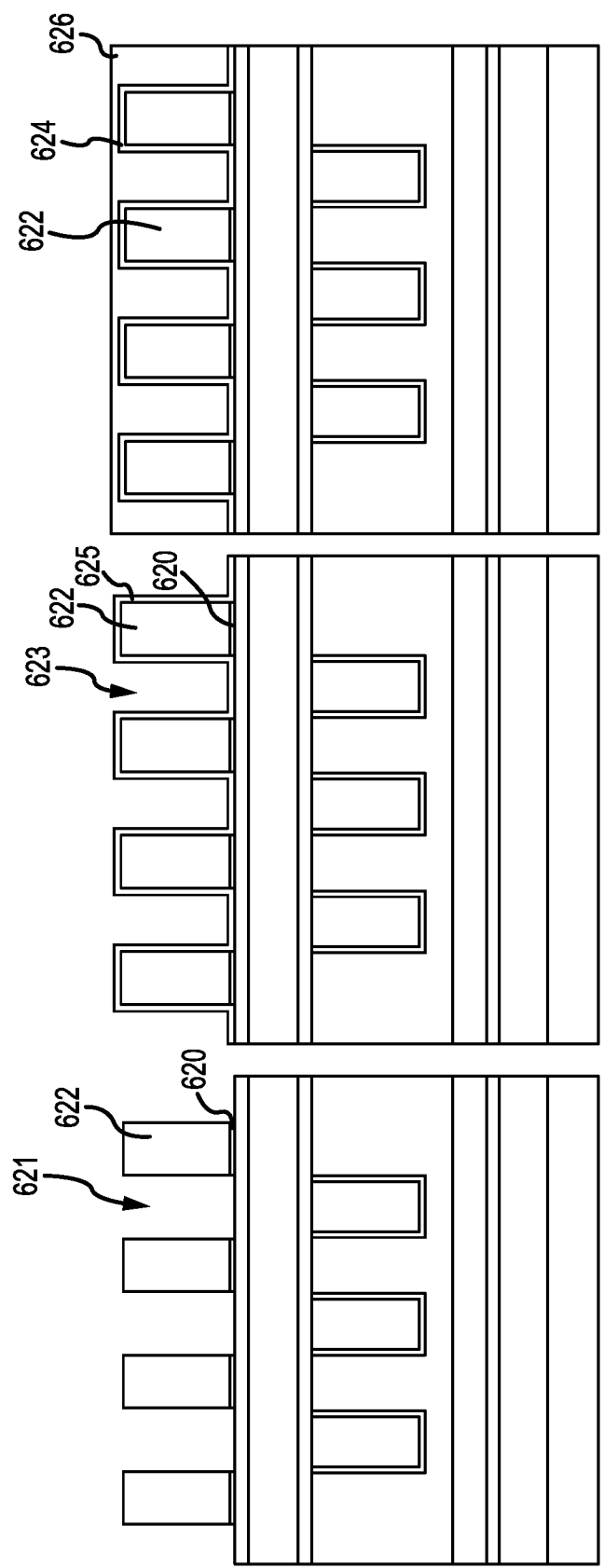

FABRICATION OF METALLIC OPTICAL METASURFACES

If an Application Data Sheet ("ADS") has been filed on the filing date of this application, it is incorporated by reference herein. Any applications claimed on the ADS for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

If the listings of applications provided above are inconsistent with the listings provided via an ADS, it is the intent of the Applicant(s) to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

FIELD

This disclosure is directed to methods for fabrication of metallic optical metasurfaces. In particular, this disclosure is directed to a damascene process for fabrication of copper holographic metasurfaces including arrays of copper pillars with nano-scale gaps between the copper pillars. The fabrication process also includes fabricating backplane structures as reflectors and filling the nano-scale gaps with a refractive index tunable core material.

BACKGROUND

Autonomous systems and applications, such as vehicles, drones, robots, security, mapping, among others, need to view the world in 3D. Scanning Light Detection and Ranging (LiDAR) is a 3D sensor used in current self-driving cars. LiDAR can also be used to make high-resolution maps and provides a dynamic field of view. Conventionally, LiDAR has been based on mechanical scanning of the laser beams to create dense point clouds.

Recently, there is strong interest in replacing mechanically scanned lidar with solid state LiDAR, which uses electronic means of optical beam steering and is therefore highly reliable and offers certain performance advantages. Solid state LiDAR can also be low power, compact, and may employ low cost CMOS fabrication techniques. The most well-known approach to solid-state beam scanning presently is the optical phased array. This patent describes the methods for fabricating a solid-state scanning device that is based on holographic metasurfaces.

BRIEF SUMMARY

In an embodiment, the disclosure provides a method for fabricating a metallic optical metasurface having an array of tunable elements. The method may include forming a first copper layer with a conducting or dielectric barrier layer over a backplane structure by a damascene process. The first copper layer comprises a plurality of nano-gaps vertically extending from the backplane structure. The plurality of nano-gaps is filled with a dielectric material. The conducting or dielectric barrier layer is between the first copper layer and the backplane structure, and also between the first copper layer and the dielectric material. The method may also include removing the dielectric material and a portion of the conducting or dielectric barrier layer to expose the portions in the nano-gaps of the first copper layer. The method may further include depositing a dielectric coating layer over the top portion and exposed side portions of the first copper layer to form a protected first copper layer, and filling the gaps with an electrically-tunable dielectric material that has an electrically-tunable refractive index.

In an embodiment, a method is provided for fabricating an optical metasurface by a copper damascene process. The method may include depositing a plurality of dielectric layers over a backplane structure and etching the dielectric layers to form a plurality of trenches in the dielectric layer. The method may also include depositing a dielectric or conducting barrier layer to prevent from copper diffusion or corrosion, sputtering a seed copper layer over the dielectric or conducting barrier layer, electroplating a first copper layer over the dielectric or conducting barrier layer to fill the trenches, and removing a top portion of the first copper layer by chemical mechanical polishing (CMP) to expose the top surface of the dielectric layers to form a plurality of copper pillars. The method may further include etching the dielectric and barrier layers to form a plurality of nano-gaps between the copper pillars, depositing a dielectric coating layer over the top and sidewalls of the copper pillars, and filling the plurality of nano-gaps with an electrically-tunable dielectric material that has an electrically-tunable refractive index.

In an embodiment, a method is provided for fabricating an optical metasurface. The method may include forming a plurality of copper pillars with a conducting barrier layer over a backplane structure by a damascene process. A plurality of nano-gaps between the plurality of copper pillars is filled with a dielectric material. The conducting barrier layer is between the first copper layer and the backplane structure, and also between the first copper layer and the dielectric material. The backplane structure comprises a stack of dielectric layers or a copper layer. The method may also include removing the dielectric material in the nano-gaps, at least the top layer of the stack of the dielectric layers, and the conducting barrier layer to expose all four sides of each of the plurality of copper pillars. The method may further include depositing a dielectric coating layer over the four sides of each of the copper pillars, and filling the nano-gaps and the space underneath the copper pillars with an electrically-tunable dielectric material that has an electrically-tunable refractive index.

Additional embodiments and features are set forth, in part, in the description that follows, and will become apparent to those skilled in the art upon examination of the specification or may be learned by the practice of the disclosed subject matter. A further understanding of the nature and advantages of the present disclosure may be realized by reference to the remaining portions of the specification and the drawings, which form a part of this disclosure.

BRIEF DESCRIPTION OF THE DRAWINGS

The description will be more fully understood with references to the following figures and data graphs, which are presented as various embodiments of the disclosure and should not be construed as a complete recitation of the scope of the disclosure, wherein:

FIG. 6G shows a cross-sectional view of chemically etching the top dielectric layer of FIG. 6F to form nano-gaps between copper pillars in accordance with embodiments of the disclosure.

FIG. 6H shows a cross-sectional view of applying a dielectric coating to the copper pillars of FIG. 6G in accordance with embodiments of the disclosure.

FIG. 6I shows a cross-sectional view of disposing an electrically-tunable material over the copper pillars and filling the nano-gaps between copper pillars of FIG. 6H in accordance with embodiments of the disclosure.

DETAILED DESCRIPTION

Figure 1A:
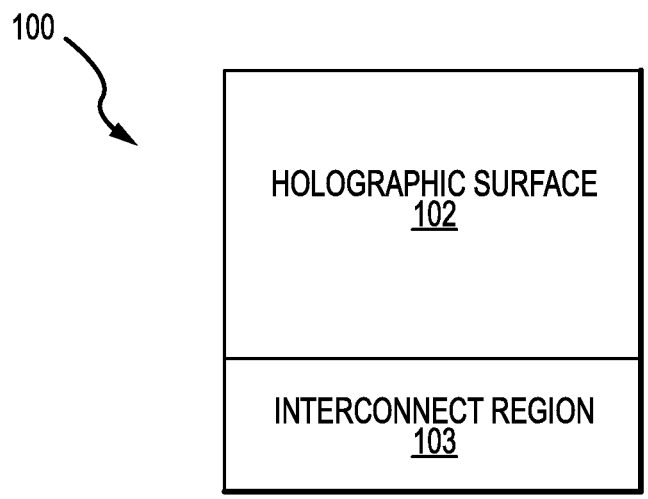
FIG. 1A shows a top overview of a metallic holographic metasurface device in accordance with embodiments of the disclosure.

The disclosure may be understood by reference to the following detailed description, taken in conjunction with the drawings as described below. It is noted that, for purposes of illustrative clarity, certain elements in various drawings may not be drawn to scale.

This patent application relates to PCT Application No. PCT/US18/19269, entitled "Control Circuitry and Fabrication Techniques for Optical Metasurfaces," filed on Feb. 22, 2018, which is incorporated herein by reference in its entirety.

This patent application also relates to U.S. patent application Ser. No. 15/924,744, filed on Mar. 19, 2018, entitled "PLASMONIC SURFACE-SCATTERING ELEMENTS AND METASURFACES FOR OPTICAL BEAM STEERING," which is incorporated herein by reference in its entirety.

Overview

The disclosure provides methods for fabricating a metallic holographic metasurface device, which is operable at higher frequencies, especially at infrared or visible frequencies. When operating frequencies are scaled up to optical (infrared/visible) frequencies, the sizes of individual scattering elements and the spacing between adjacent scattering elements are proportionally scaled down to preserve the sub-wavelength/metamaterial aspect of the technology. The relevant length scales for operation at optical frequencies are typically on the order of microns or less, which are smaller than the typical length scales for conventional printed circuit board (PCB) processes.

The metallic holographic metasurafce device includes an array of hologram elements, which can be a one-dimensional (1D) array or a two-dimensional (2D) array. Each hologram element includes a pair of metal pillars, an electrically-tunable material, and a backplane structure as reflector.

Compared to the optical metasurfaces disclosed in the PCT Application No. PCT/US18/19269, the metallic optical metasurface includes metal pillars (e.g. copper pillars) rather than the dielectric pillars in the hologram elements. There are several benefits of using the metal pillars to replace the dielectric pillars.

Optically, the metal pillars reduce the coupling between the hologram elements of the metallic holographic metasurfaces. The metal pillars do not allow the optical field to be penetrated in from the electrically-tunable material, such that the optical field is substantially confined within the electrically-tunable material. As a result, the metal pillars isolate the hologram elements from each other in the array and reduce the optical coupling between the hologram elements. In contrast, the dielectric pillars (e.g. amorphous silicon pillars) allow the optical field to penetrate into the pillars from the electrically-tunable material, such that the hologram elements are coupled together.

Electrically, the metal pillars are better conductor than amorphous-silicon pillars. Hence, the metallic optical metasurfaces have smaller ohmic loss than the optical metasurfaces with dielectric pillars. The metal pillars may include copper, gold, silver, aluminum, among others.

The present disclosure is directed to a damascene process for fabrication of copper holographic metasurfaces, which include an array of copper pillars with electrically-tunable material filled in the nano-scale gaps between the copper pillars.

The present disclosure provides methods of using a damascene process for patterning the copper pillars. The damascene process has been developed for manufacturing semiconductor integrated circuits, which use copper for interconnections to transistors in metallization layers.

The present disclosure provides methods for adding a dielectric barrier layer to protect copper from diffusion. The barrier layer can also prevent copper from corrosion. This is entirely different from the electronic devices or semiconductor integrated circuits. In the electronic devices, a conducting barrier layer including Ta and/or TaN is used to protect copper from diffusion into insulators. The conducting barrier layer including Ta and/or TaN helps protect copper from diffusion into insulators and also electrically connects to the two copper layers. On the other hand, the dielectric barrier layer for copper would not work, because the dielectric layer prevents the two copper layers from being electrically connected.

The present disclosure also provides methods for adding a conductive barrier layer including Ta and/or TaN to the copper, but then removing a portion of the conductive barrier layer to reduce the optical loss due to the conducting barrier layer and recoating the copper with a dielectric barrier layer. The reason for this removal of Ta and/or TaN is that Ta and TaN are very absorptive to light in the frequency range of interest. The presence of Ta and TaN would affect the optical performance of the metallic optical metasurface, but does not affect the electrical performances of the circuits.

A method may also include filling the nano-gaps between the copper pillars with an electrically-tunable material to form a metallic optical metasurface device. The electrically-tunable material may include liquid crystals, Electro-optic (EO) polymer material, or Chalcogenide Glasses, among others. The electrically-tunable material has a refractive index that can be tuned by applying an electric voltage.

Metallic Optical Metasurface

FIG. 1A shows a top overview of a metallic holographic metasurface device in accordance with embodiments of the disclosure. As shown in FIG. 1A, a metallic holographic metasurface device 100 has a metallic holographic metasurface region 102, including an array of holographic elements on a first portion of a base 108, which can be seen in FIG. 1B. The metallic holographic metasurface region 102 includes an array of hologram elements. Each holographic element includes a pair of metal pillars and a refractive index tunable core material (i.e. electrically-tunable material) between the pair of metal pillars.

The holographic metasurface device 100 may also have an interconnect region 103 including CMOS transistors on a second portion of the chip. The CMOS transistors in the interconnect region 103 can control the voltage applied to the metal pillars of each of the holographic elements. The CMOS transistors have low static power consumption and high noise immunity. The array of holographic elements and the electrical control circuit are decoupled. In some embodiments, the interconnect region 103 may include a complex routing of wires with no active elements.

In some embodiments, the interconnect region may be at least partially mixed within the holographic metasurface (not shown). For instance, the metallic holographic metasurface may have an active control in which the circuits are partially below the holographic surface.

Figure 1B:
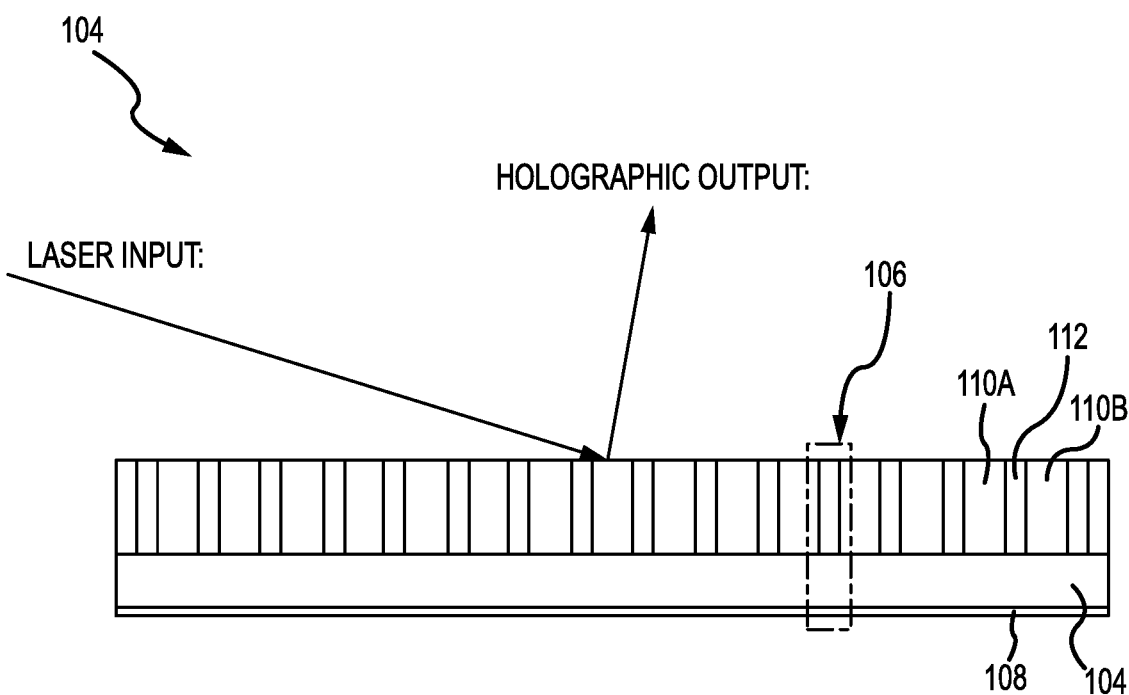
FIG. 1B is a cross-sectional view of 1D metallic holographic metasurface device in accordance with embodiments of the disclosure.

FIG. 1B is a cross-sectional view of 1D metallic holographic metasurface device in accordance with embodiments of the disclosure. As shown in FIG. 1B, an array 102 includes a plurality of columns of metallic holographic elements 106 arranged linearly on a wafer. The metallic holographic elements or resonators 106 include a pair of metal pillars 110A-110B and an electrically-tunable material 112 between the metal pillars. The metal pillars are deposited over a backplane structure 104. In some embodiments, the backplane structure 104 may include one of full backplane, partial backplane, notch design, or Bragg reflector, among others.

The grazing incidence of the incident wave, such as a laser input as shown in FIG. 1B, excites resonances in the gaps between the metal pillars with a relatively high Q factor, enabling dynamic modulation of the phase. Additionally, the metal pillars are deposited over a backplane structure, which makes the structure operate as a reflect-array and thus is possible to integrate with control electronics. The resonator includes two metal pillars that are separated by an electrically-tunable material having a tunable refractive index. The resonator produces a holographic output as shown in FIG. 1B.

The reflection phase of the metal pillars is sensitive to the refractive index of the core material, with phase modulation of nearly $2\pi$ possible with an index modulation of $\Delta n/n$ of about 7%. The high sensitivity to the refractive index of the core material is enabled by the high Q of the resonance, for example, a Q of 20. The high sensitivity of the reflection phase to the refractive index of the core enables the integration of refractive index tunable core material into the gaps between the metal pillars to create dynamic metasurfaces.

Since the refractive index modulation range of the tunable dielectric materials may be small, one challenge for designing an array of tunable radiating or scattering elements is to create a high Q factor, low-loss, subwavelength resonators. The Q factor is a dimensionless parameter that characterizes a resonator's bandwidth relative to its center frequency. High Q factor indicates a lower rate of energy loss relative to the stored energy of the resonator. Resonators with high Q factors have low damping.

The backplane structure 104 is deposited over a base 108 for supporting the metal pillars. In some embodiments, the base 108 may include a wafer substrate, which may be a crystalline silicon wafer, among others. In some embodiments, the base 108 may include a wafer substrate and also a plurality of layers for wires.

The backplane structure 104 reflects optical waves. A control voltage is applied across the two metal pillars 202 to create static electric field across the holographic element 106A. Both the electric field and magnetic field are well confined to the electrically-tunable material 112 in the nano-gap between the two metal pillars 110A-110B.

Figure 2:
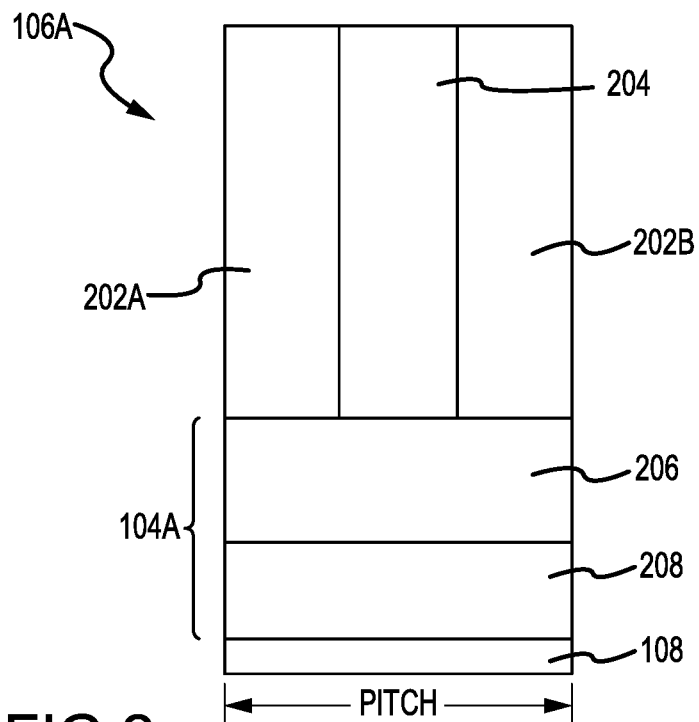
FIG. 2 shows a cross-sectional view of one sub-wavelength holographic element including a pair of copper pillars and a full backplane structure in the array of FIG. 1B in accordance with embodiments of the disclosure.

FIG. 2 shows a cross-sectional view of one of the sub-wavelength holographic element 106A having a resonator including a pair of metal pillars and a full backplane structure in the array of FIG. 1B in accordance with embodiments of the disclosure. As depicted, a metallic holographic element 106A, e.g. a sub-wavelength metallic holographic element, includes a resonator having an electrically-tunable material or refractive index tunable material 204 between two metal pillars 202, over a backplane structure 104A, which is placed between the base 108 and metal pillars 202A-B. The full backplane structure 104A may include a dielectric layer 206 over a metal layer 208, as shown in FIG. 2. The dielectric spacer 206 may include at least one thin chemically resistant layer and at least a thick dielectric layer.

Both the electric field and magnetic field are well confined to the electrically-tunable material 204 in the nano-gap between the two metal pillars 202A-202B. The electric field and magnetic field are mostly confined between both the top end and the bottom end of the resonator.

Figure 3:
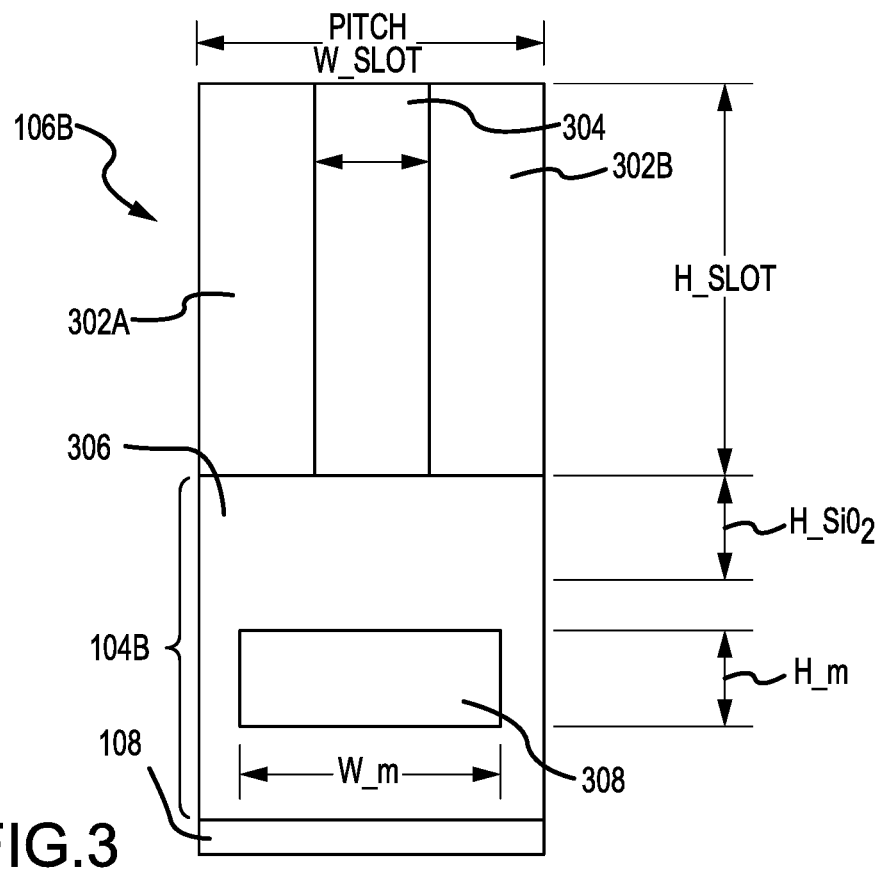
FIG. 3 shows a cross-sectional view of one sub-wavelength holographic element including a pair of copper pillars and a partial backplane structure in the array of FIG. 1B in accordance with embodiments of the disclosure.

FIG. 3 shows a cross-sectional view of one of the sub-wavelength holographic element 106B having a resonator including a pair of metal pillars and a partial backplane structure in the array of FIG. 1B in accordance with embodiments of the disclosure. As depicted, a metallic holographic element 106B, e.g. a sub-wavelength metallic holographic element, includes a resonator having a refractive index tunable material 304 between two metal pillars 302, over a backplane structure 104B, which is placed between the base 108 and metal pillars 302A-B. The partial backplane structure 104B may include a metal patch 308 embedded in a dielectric layer 306. The metal patch 308 may be in a rectangular shape having a height labeled as H_m and width labeled as W_m. The metal patch 308 is located under the electrically-tunable material 304. The width of the metal patch 308 may vary from zero to nearly the pitch. When the width of the metal patch equals to the pitch, the partial backplane structure becomes a full backplane structure.

When the metal patch is formed of copper, the width of the copper patch may be designed by considering the impact of the width on both manufacturing and optical performance. On one hand, it is easier to fabricate the copper patch with reduced width of the copper patch. On the other hand, when the width of the copper patch increases, the optical performance becomes better.

Again, both the electric field and magnetic field are well confined to the electrically-tunable material 304 in the nano-gap between the two metal pillars 302A-B. Both the electric field and magnetic field are mostly confined between both the top end and the bottom end of the resonator.

Figure 4:
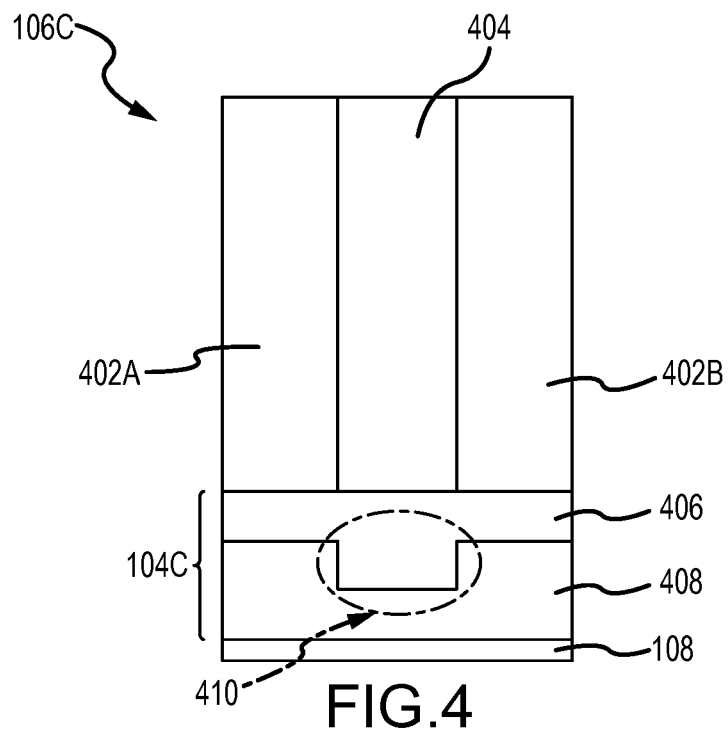
FIG. 4 shows a cross-sectional view of one sub-wavelength holographic element including a pair of copper pillars and a notch design backplane structure in the array of FIG. 1B in accordance with embodiments of the disclosure.

FIG. 4 shows a cross-sectional view of one of the sub-wavelength holographic element 106C having a resonator including a pair of metal pillars and a notch design backplane structure in the array of FIG. 1B in accordance with embodiments of the disclosure. As depicted, a metallic holographic element 106C, e.g. a sub-wavelength metallic holographic element, includes a resonator having a refractive index tunable material 404 between two metal pillars 402, over a backplane structure, which is placed between the base 108 and metal pillars 402A-B.

The notch design backplane structure 104C may include a dielectric layer 406 having a notch 410 over a metal layer 408. The notch 410 is located under the electrically-tunable material 404 in the nano-gap. The notch 410 connects to the dielectric layer 406 and protrudes into the metal layer 408. The notch can prevent coupling between unit cells by forcing a node in magnetic field at the location of the dielectric spacer.

Again, both the electric field and magnetic field are well confined to the electrically-tunable material 404 in the nano-gap between the two metal pillars 402A-B. The electric field and magnetic field are mostly confined between both the top end and the bottom end of the resonator.

Figure 5:
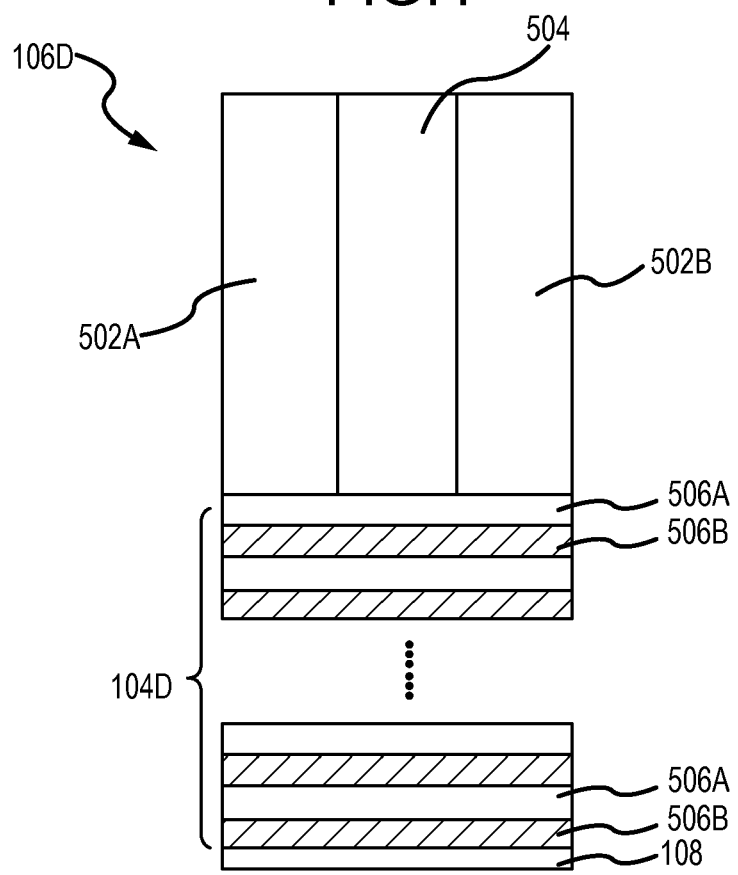
FIG. 5 shows a cross-sectional view of one sub-wavelength holographic element including a pair of copper pillars and a Bragg reflector backplane structure in the array of FIG. 1B in accordance with embodiments of the disclosure.

FIG. 5 shows a cross-sectional view of one of the sub-wavelength holographic element 106D having a resonator including a pair of metal pillars and a Bragg reflector backplane structure in the array of FIG. 1B in accordance with embodiments of the disclosure. As depicted, a metallic holographic element 106D, e.g. a sub-wavelength metallic holographic element, includes a resonator having a refractive index tunable material 504 between two metal pillars 502A-B, over a backplane structure, which is placed between the base 108 and metal pillars 502A-B.

The Bragg reflector backplane structure 104D may include a plurality of dielectric layers having a dielectric layer 506A with a low dielectric index interleaved with a dielectric layer 506B with a high dielectric index. The Bragg reflector backplane structure 104D is a non-metal reflector.

Again, both the electric field and magnetic field are well confined to the electrically-tunable material 504 in the nano-gap between the two metal pillars 502A-B. The electric field and magnetic field are mostly confined between both the top end and the bottom end of the resonator 106D.

In the resonators of the above metallic hologram elements 106A-D, the number of nodes or anti-nodes may vary with the height of the metal pillars. For example, for a height of the metal pillars, there are two nodes or two anti-nodes in the electric field and two nodes or two anti-nodes in the magnetic field. When the height of the resonator including the metal pillars and the electrically-tunable material is reduced, the resonator may have only one resonance. When the height of the resonator increases, the resonator may have three, four or more nodes.

Tuning the height is done during fabrication. Once the height is fixed for the resonator, the backplane structure can be tuned around the resonance. Then, the refractive index of the tunable material can be tuned.

As an example, Table 1 lists the dimensions of the pitch, heights, and widths for the resonator and the partial backplane structure as shown in FIG. 3. As an example, the dielectric layer 306 is $SiO_2$.

TABLE 1

| Dimension of Metallic Holographic Element | |
|---|---|
| | Dimension Range (nm) |
| H_slot | 400-600 |
| W_slot | 100-200 |
| Pitch | 350-500 |
| H_SiO$_2$ | 50-200 |
| W_m | 200-500 |
| H_m | 50-500 |

The particular dimensions in Table 1 are for operation wavelength of 905 nm. These dimensions may change with wavelength. For example, at a wavelength of 1550 nm, the parameters should be multiplied by a factor equal to a ratio of the two wavelengths, i.e. 1550/905.

For the full backplane structure 104A and the Bragg reflector backplane structure 104D, the pitch is the width (W_m).

For the notch design backplane structure 104C, the notch has a width of W_slot, and a depth ranging from 100 nm to 150 nm at wavelength of 905 nm.

It will be appreciated by those skilled in the art that the dimensions of the height, width, and pitch may vary.

Damascene Process

The damascene process has been developed for manufacturing semiconductor integrated circuits, which use copper for interconnections to transistors in metallization layers. In the fabrication of semiconductor chips, copper is patterned with the damascene process. This is because copper cannot be patterned by known techniques of photoresist masking and plasma etching that have been used with great success with aluminum. It is known in the art that copper is a better conductor than aluminum. Hence, semiconductor chips using copper-based chips can have smaller metal components, and use less electrical energy, and lead to higher-performance processors. With these advantages over aluminum, great development effort has been made in the damascene process.

In the damascene process, the underlying dielectric insulating layer (e.g. silicon oxide) is patterned with trenches where the conductor fills in. A thick coating of copper layer overfills the trenches and deposits on the insulating layer. Then, chemical-mechanical planarization (CMP) is used to remove the copper that extends above the top surface of the insulating layer for planarization. Copper within the trenches of the dielectric insulating layer becomes the patterned conductor.

The damascene process may be a single damascene process, or a dual-damascene process. In some embodiments, the single damascene process may include two separate damascene steps may be used to separately form trenches and vias. This single damascene process may be used in forming devices where vias are not present.

In some embodiments, the dual-damascene process combines forming two features to reduce the number of process steps. The dual-damascene process generally forms and fills two features with copper simultaneously, e.g. trenches overlying vias, using a single copper deposition. With successive layers of insulator and copper, a multilayer interconnection structure is created.

Besides this simplification to the number of steps, the dual-damascene process and the single damascene process are largely identical. It would be known to those skilled in the art that anything possible in the single-damascene process is likely possible in the dual-damascene process.

In the damascene process, a conducting barrier layer completely surrounds all copper interconnections. The conducting barrier layer prevents copper from diffusion into any surrounding materials, which would degrade the properties of the surrounding materials. For example, silicon can form deep-level traps when doped with copper. The conducting barrier layer can reduce copper diffusivity sufficiently, thus chemically isolates the copper from the dielectric insulator (e.g. silicon oxide) while still having high electrical conductivity in order to maintain a good electronic contact.

The conducting barrier layer or film may not be too thick, such that a stack of two conducting barrier films and a copper conductor may have a total resistance that exceeds the resistance of aluminum interconnects. In some embodiments, the conducting barrier layer is added on all four sides of the copper conductor to reduce diffusion. In some embodiments, the conducting barrier is applied to the sides and the bottom and the top surface is usually a dielectric barrier instead of a Ta/TaN barrier. Typical barrier metals include Ta and TaN, among others.

Fabrication of Metallic Optical Metasurfaces

Example 1

FIGS. 6A-6I provide steps for forming a metallic optical metasurface using the damascene process. The metallic optical metasurface includes a partial backplane structure as a reflector, as shown in FIG. 2. The method includes fabricating the partial backplane structure including copper patches. The method also includes forming patterned copper pillars with a dielectric barrier layer (e.g. nitride layer). The method replaces a conducting barrier layer (e.g. Ta and/or Ta nitride) commonly used in a conventional damascene process with a dielectric barrier layer for the copper holographic metasurfaces. The method also includes recoating the copper pillars with a dielectric coating layer (e.g. nitride layer) to prevent copper from migrating into the dielectric insulator layer (e.g. silicon oxide). The method also includes filling the nano-gap between the copper pillars with an electrically-tunable material.

Figure 6A:
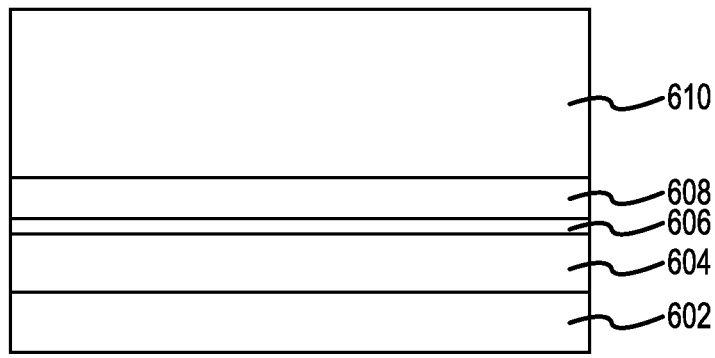
FIG. 6A shows a cross-sectional view of deposition of a plurality of dielectric layers over a wafer substrate in accordance with embodiments of the disclosure.

FIG. 6A shows a cross-sectional view of the deposition of a plurality of dielectric layers over a wafer substrate in accordance with embodiments of the disclosure. As shown in FIG. 6A, a stack of dielectric layers 604, 606, 608, and 610 are deposited over a wafer substrate 602. The dielectric layers may include a dielectric material, such as silicon nitride (SiN), silicon nitride carbide (SiCN), silicon carbide (SiC), aluminum oxide ($Al_2O_3$), hafnium(IV) oxide ($HfO_2$), silicon oxide ($SiO_2$), among others. The deposition technique may include physical vapor deposition (PVD), chemical vapor deposition (CVD), or plasma enhanced chemical vapor deposition (PECVD), among others.

Figure 6B:
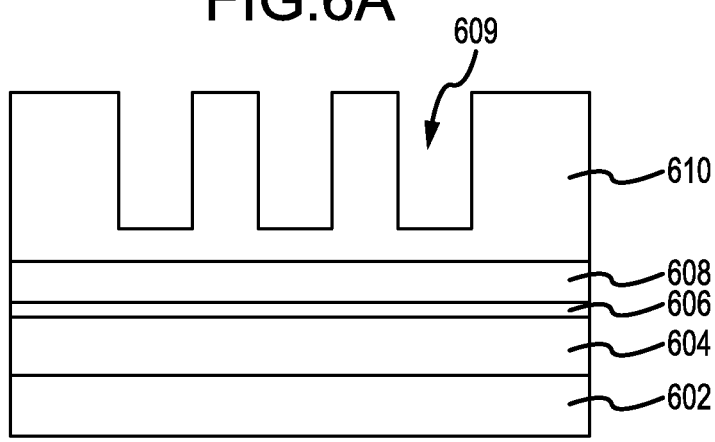
FIG. 6B shows a cross-sectional view of etching the top dielectric layer of FIG. 6A to form trenches in accordance with embodiments of the disclosure.
Figure 6C:
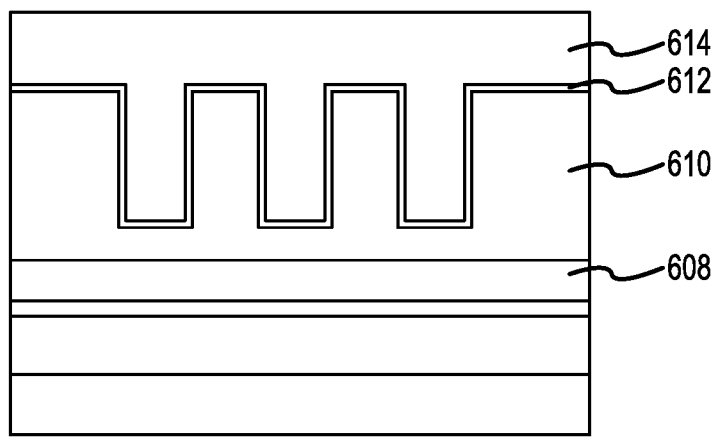
FIG. 6C shows a cross-sectional view of depositing liner and copper layer over trenches and also the top dielectric layer of FIG. 6B in accordance with embodiments of the disclosure.
Figure 6D:
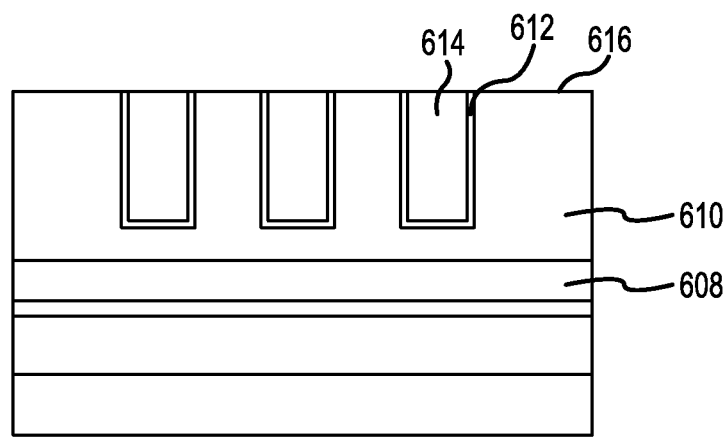
FIG. 6D shows a cross-sectional view of chemical mechanical planarization (CMP) of the copper layer of FIG. 6C to expose the top dielectric layer in accordance with embodiments of the disclosure.

FIGS. 6B-6D show the steps for forming the partial backplane structure including copper patches. FIG. 6B shows a cross-sectional view of etching the top dielectric layer of FIG. 6A to form trenches in accordance with embodiments of the disclosure. As shown in FIG. 6B, trenches 609 are formed in the top dielectric layer 610 by dry etch or plasma etch. The dry etch or plasma etch can etch in a vertical direction such that vertical trenches can be formed in the dielectric layers.

FIG. 6C shows a cross-sectional view of depositing liner and copper layer over trenches and also the top dielectric layer of FIG. 6B in accordance with embodiments of the disclosure. As shown, the copper is deposited over the liner 612. The copper layer 614 is protected with the liner 612. The liner 612 may be a conductive barrier material, such as Ta and/or TaN, among others.

The copper layer may be electroplated into the trenches coated with the liner 612. The electroplating deposition may be a two-step process. A seed layer may be first deposited using the physical vapor deposition (PVD) and then the copper is electroplated over the seed layer.

FIG. 6D shows a cross-sectional view of chemical mechanical planarization (CMP) of the copper layer of FIG. 6C to expose the top dielectric layer in accordance with embodiments of the disclosure. As shown in FIG. 6D, copper patches 614 are formed by using CMP for planarization of the copper layer. The copper patches are embedded within the top dielectric layer 610.

Figure 6E:
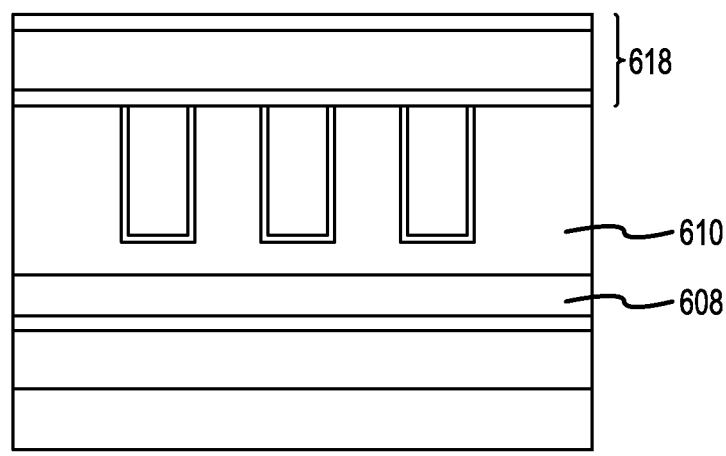
FIG. 6E shows a cross-sectional view of depositing dielectric layers over the copper layer and the top dielectric layer of FIG. 6D in accordance with embodiments of the disclosure.

FIG. 6E shows a cross-sectional view of depositing dielectric layers over the copper layer and the top dielectric layer of FIG. 6D in accordance with embodiments of the disclosure. As shown, a dielectric spacer 618 is deposited over the planarized copper patches 614 and the dielectric layer 610.

The dielectric spacer may include a plurality of dielectric layers. As an example, the dielectric spacer may include a top nitride layer, a bottom nitride layer, and an oxide layer between the top nitride layer and the bottom nitride layer. The dielectric spacer may include a dielectric material, such as SiN, SiCN, SiC, $Al_2O_3$, $HfO_2$, $SiO_2$, among others. The deposition technique may include PVD, CVD, or PECVD, among others. It will be appreciated by those skilled in the art that the dielectric spacer may vary in materials and thicknesses.

Figure 6F:
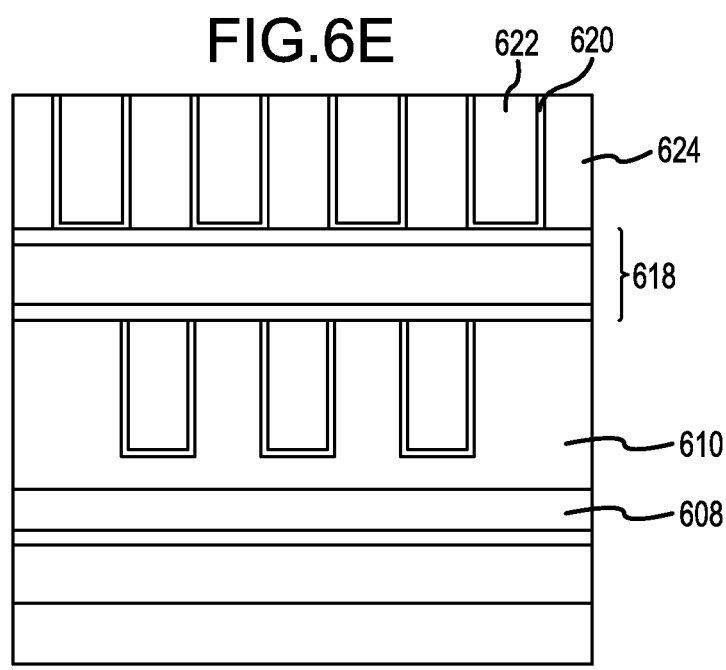
FIG. 6F shows a cross-sectional view of patterning the copper layer over the dielectric layer of FIG. 6E using a damascene process in accordance with embodiments of the disclosure.

FIG. 6F shows a cross-sectional view of patterning the copper layer over the dielectric layer of FIG. 6E using a damascene process in accordance with embodiments of the disclosure. As shown, copper pillars 622 are formed with nano-gaps in between. A dielectric barrier layer 620 covers the sidewalls and the bottom of the copper pillars 622. A dielectric layer 624 fills the space in the nano-gaps between the copper pillars. The dielectric barrier layer 620 is optically transparent, and may include a dielectric material, such as silicon nitride (SiN), silicon nitride carbide (SiCN), silicon carbide (SiC), aluminum oxide ($Al_2O_3$), hafnium(IV) oxide ($HfO_2$), silicon oxide ($SiO_2$), and optically transparent materials that are barriers to copper diffusion, among others.

In some embodiments, the damascene process may be a dual-damascene process, which may involve making the electrical via connections between elements in copper pillars 622 and copper patches 614. If a dielectric liner is used for dielectric barrier layer 620, these connections are not possible, and electrical contact can be made to the top side of copper pillars 622 in another layer in the IC region.

In some embodiments, the sequence of FIGS. 6A-F depicts a single damascene process, since there is only one etch step. If the process were dual damascene, there may be another etching run as shown in FIG. 6B, with the etches running to a different depth. Also, for the dual-damascene process, there may be a wet etch step between FIG. 6B and FIG. 6C, to expose underlying Cu.

The method includes forming the trenches in the dielectric layer 624 and vias (not shown). The vias are connected to the copper pillars for applying an electric voltage to the copper pillars.

The method includes depositing the dielectric barrier layer 620 over the trenches, as shown in FIG. 6F. This method is different from the conventional fabrication method for semiconductor integrated circuit chips in which a conductive barrier (e.g. Ta/TaN) is commonly applied to the trenches, such as shown in FIG. 6C.

The method also includes depositing the copper layer over the trenches by electroplating and followed by CMP to form copper patches 622.

In some embodiments, the vias may not be present in the holographic surface of the metallic optical metasurface, such as shown in FIG. 1A. In alternative embodiments, the vias may be present in an active metallic optical metasurface (not shown), or in the interconnect region 103 of the metallic optical metasurface. The vias and the trenches are formed using the dual-damascene process. The copper is deposited in the vias and trenches simultaneously in a single deposition operation.

FIG. 6G shows a cross-sectional view of chemically etching the top dielectric layer of FIG. 6F to form nano-gaps between copper pillars in accordance with embodiments of the disclosure. As shown, the dielectric layer 624 between the copper pillars 622 is removed by chemically etching using an etchant, such as buffered oxide etchant (BOE). The chemical etching can etch in all direction, unlike the plasma etching. The etchant may etch one dielectric material, such as oxide, but may not etch another neighboring dielectric material, such as nitride.

Also, as shown in FIG. 6G, the etchant removes the dielectric barrier layer 620 on the vertical side walls of the copper pillars 622, while the bottom dielectric barrier layer 620 remains between the copper pillars 622 and the dielectric layers 618 underneath the copper pillars 622.

FIG. 6H shows a cross-sectional view of applying a dielectric coating layer to the copper pillars of FIG. 6G in accordance with embodiments of the disclosure. As shown in FIG. 6H, a dielectric coating layer 625 is deposited over the top and sides of the planarized copper pillars 622. The dielectric coating layer 625 is also deposited over the exposed top portion of the dielectric layers 618 between the copper pillars 622.

The dielectric coating layer 625 may be applied by using atomic layer deposition (ALD) or plasma enhanced chemical vapor deposition (PECVD). The dielectric coating layer 625 is optically transparent, and may include a dielectric material, such as SiN, SiCN, SiC, $Al_2O_3$, $HfO_2$, $SiO_2$, and optically transparent materials that are barriers to copper diffusion, among others. The dielectric coating layer 625 may be applied very quickly to have the minimum exposure of copper without any protection layer.

FIG. 6I shows a cross-sectional view of disposing an electrically-tunable material over the copper pillars and filling the nano-gaps between copper pillars of FIG. 6H in accordance with embodiments of the disclosure. As shown, the electrically-tunable material 626 fills the nano-gap 623 between the copper pillars 622. In this embodiment, the electrically-tunable material 626 covers the top of the dielectric coating layer 625.

In an alternative embodiment, the electrically-tunable material 626 may not cover the top of the dielectric coating layer 626. The electrically-tunable material may include liquid crystals. The electrically-tunable material may be spin coated into the nano-gap.

The method further includes encapsulating the electrically-tunable material with an optically transparent material, such as glasses and polymers. The polymers may include, poly(methyl methacrylate) (PMMA) or polycarbonate (PC), among others.

Example 2

The disclosure also provides methods for removing at least a portion of a conducting barrier layer (e.g. Ta and/or TaN) in the damascene process and applying a dielectric coating layer for the copper holographic metasurfaces. The Ta and/or TaN barrier materials are very absorptive to optical light at the frequency ranges of the holographic metasurfaces. With the presence of the Ta and TaN barrier layer, the copper optical metasurfaces would have very low or nearly zero efficiency. The present disclosure identifies the problem and provides the solution to solve the problem by removing the Ta and TaN barrier layer.

Figure 7A:
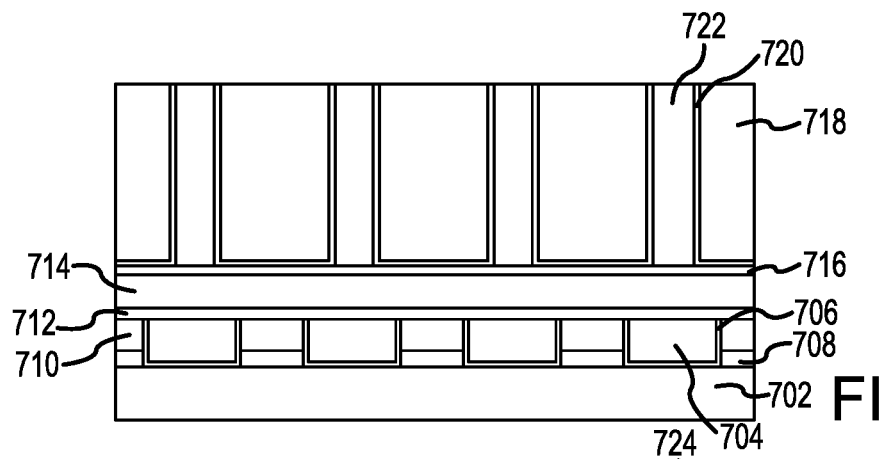
FIG. 7A shows a cross-sectional view of forming patterned copper pillars and copper patches using a damascene process in according to embodiments of the disclosure.

FIG. 7A shows a cross-sectional view of forming patterned copper pillars and copper patches using a damascene process in according to embodiments of the disclosure. As shown, copper pillars 718 are formed with a conducting barrier layer 720 (e.g. Ta and/or TaN) over a partial backplane structure including a dielectric spacer having respective bottom, middle, and top dielectric layers 712, 714, and 716, copper patches 704, conducting barrier 706 (e.g. Ta and/or TaN) over a base 702. A top dielectric layer 722 fills the nano-gap between the coated copper pillars 718. The copper patches 704 are embedded with the dielectric layers 708 and 710 under the dielectric layer 712. The electrically conducting barrier layer (e.g. Ta and/or TaN) is deposited over the copper to seal the copper from diffusion. The Ta and TaN layer may be deposited by sputtering.

Figure 7B:
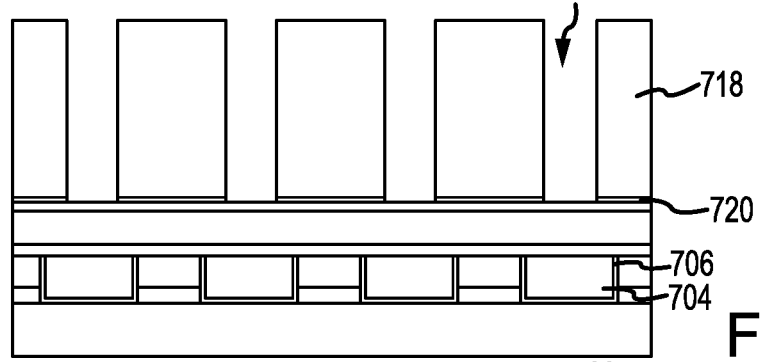
FIG. 7B shows a cross-sectional view of chemically etching the dielectric layer of FIG. 7A to remove the top dielectric layer and the conducting barrier to form nano-gaps between the copper pillars in according to embodiments of the disclosure.

FIG. 7B shows a cross-sectional view of chemically etching the dielectric layer of FIG. 7A to remove the top dielectric layer and the conducting barrier to form nano-gaps between the copper pillars in according to embodiments of the disclosure. As shown in FIG. 7B, the dielectric layer 722 is chemically etched away by using an etchant, such as BOE, among others, depending upon the dielectric materials to be etched. Also, the conducting barrier layer on the sidewalls of the copper pillars 718 is chemically etched away, for example with the same etchant as for etching the dielectric layer 722.

Figure 7C:
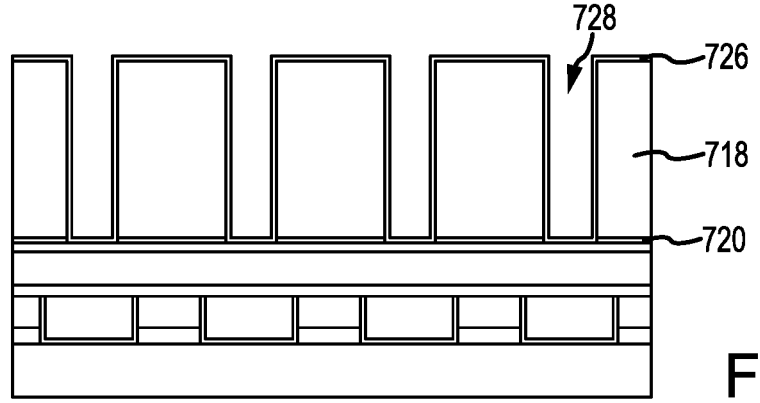
FIG. 7C shows a cross-sectional view of applying a dielectric coating to the copper pillars of FIG. 7B in accordance with embodiments of the disclosure.

FIG. 7C shows a cross-sectional view of applying a dielectric coating to the copper pillars of FIG. 7B in accordance with embodiments of the disclosure. As shown in FIG. 7C, a dielectric coating layer 726 is deposited over the copper pillars 718 to protect the copper pillars from diffusion and/or corrosion. This step may also be referred to a passivating operation. A nano-gap 728 is formed between the coated copper pillars 718.

Figure 7D:
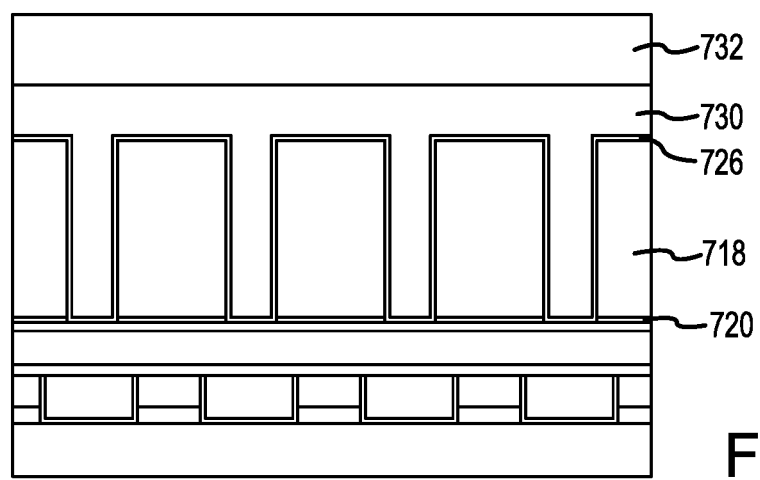
FIG. 7D shows a cross-sectional view of disposing an electrically-tunable material over the copper pillars and filling the nano-gaps between copper pillars of FIG. 7C in accordance with embodiments of the disclosure.

FIG. 7D shows a cross-sectional view of disposing an electrically-tunable material over the copper pillars and filling the nano-gaps between copper pillars of FIG. 7C in accordance with embodiments of the disclosure. As shown in FIG. 7D, an electrically-tunable material 730 fills the nano-gap 728 and also covers the top of the copper pillars 718. An optically transparent layer 732 is disposed over the electrically-tunable material 730. The optically transparent layer 732 may include glasses, polymers, among others. For example, a solid piece of glass or glass lid can cover the electrically-tunable material 730 as a protection layer.

In an alternative embodiment, the electrically-tunable material only fills the nano-gap between the copper pillars, but not present over the top of the copper pillars. Hence, the optically transparent layer is disposed directly over the coated copper pillars and the electrically-tunable material.

Example 3

The disclosure also provides an alternative embodiment where the metallic optical metasurface further removes the conducting barrier layer 720 underneath the copper pillars, which reduces the light absorption of the conducting barrier layer 720 underneath the copper pillars, as shown in FIG. 7D.

Figure 8A:
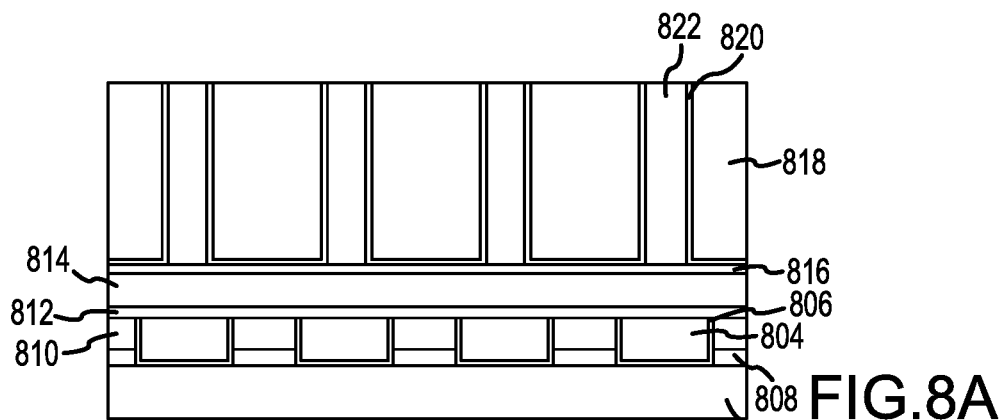
FIG. 8A shows a cross-sectional view of forming patterned copper pillars and copper patches using a damascene process in according to embodiments of the disclosure.

FIGS. 8A-8D illustrate the steps for forming the alternative metallic optical metasurface. FIG. 8A shows a cross-sectional view of forming patterned copper pillars and copper patches using a damascene process in according to embodiments of the disclosure. As shown, copper pillars 818 are formed with a conducting barrier layer 820 (e.g. Ta and/or TaN) over a partial backplane structure including a dielectric spacer having respective dielectric layers 812, 814, and 816, copper patches 804, conducting barrier 806 (e.g. Ta and/or TaN) over a base 802. The base may include a wafer substrate among others. A top dielectric layer 822 fills the nano-gap between the coated copper pillars 818. The copper patches 804 are embedded with the dielectric layers 808 and 810 underneath the dielectric layer 812. The conducting barrier layer (e.g. Ta and/or TaN) may be deposited over the copper by sputtering.

Figure 8B:
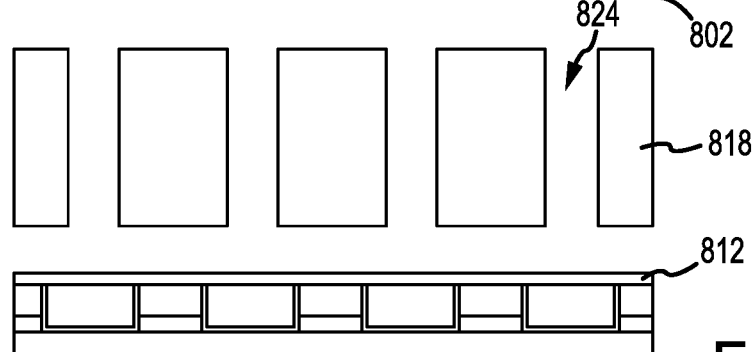
FIG. 8B shows a cross-sectional view of chemically etching the top dielectric layer of FIG. 8A to remove the top dielectric layer, the conducting barrier surrounding the copper pillars, and the dielectric layers underneath the copper pillars to form nano-gaps between the copper pillars in according to embodiments of the disclosure.

FIG. 8B shows a cross-sectional view of chemically etching the top dielectric layer of FIG. 8A to remove the top dielectric layer, the conducting barrier layer surrounding the copper pillars, and the dielectric layers underneath the copper pillars to form nano-gaps between the copper pillars in according to embodiments of the disclosure. As shown in FIG. 8B, the top dielectric layer 822 is removed by chemical etching using an etchant. The two dielectric layers 814 and 816 underneath the copper pillars are also removed by chemical etching. Also, the conducting barrier 820 is completely removed from the sidewalls and the bottom of the copper pillars 818.

The copper pillars can be supported by other mechanical means. For example, mechanical support may be provided by vias connections at regular intervals. These vias connect to anchoring features in the ground plane layer, which are electrically separated from the reflector features.

Figure 8C:
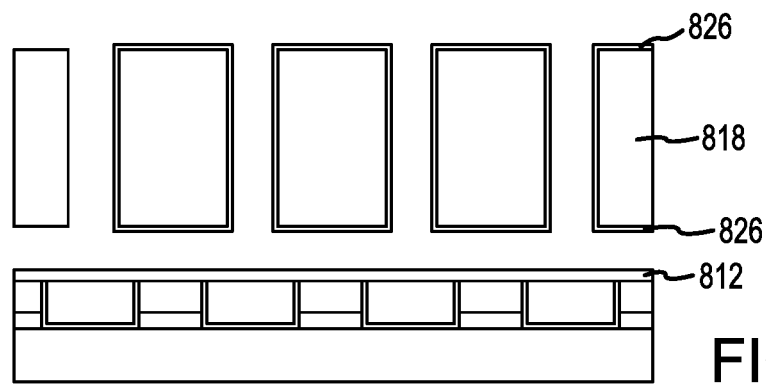
FIG. 8C shows a cross-sectional view of applying a dielectric coating to the copper pillars of FIG. 8B in accordance with embodiments of the disclosure.

FIG. 8C shows a cross-sectional view of applying a dielectric coating to the copper pillars of FIG. 8B in accordance with embodiments of the disclosure. As shown, a dielectric coating 826 is deposited around the four sides of each of the copper pillars, including the top, sidewalls, and the bottom of the copper pillars 818.

Figure 8D:
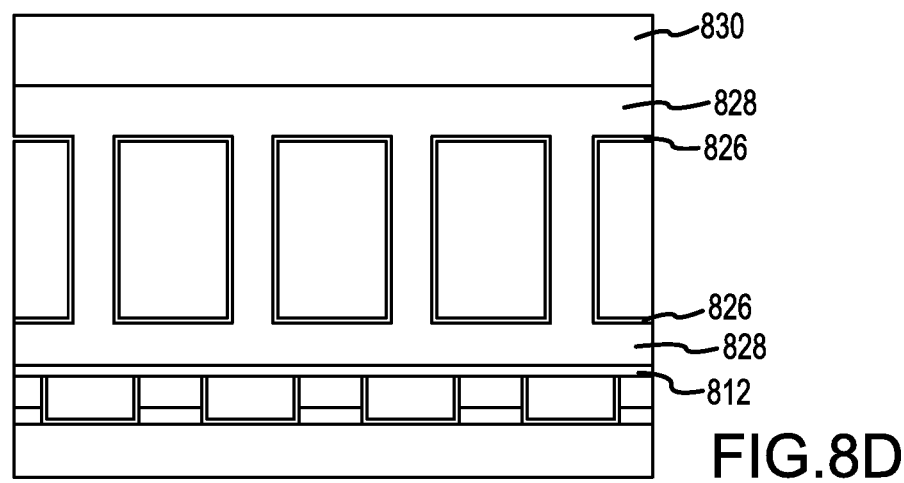
FIG. 8D shows a cross-sectional view of disposing an electrically-tunable material over the copper pillars and filling the nano-gaps between copper pillars and underneath the pillars of FIG. 8C in accordance with embodiments of the disclosure.

FIG. 8D shows a cross-sectional view of disposing an electrically-tunable material over the copper pillars and filling the nano-gaps between copper pillars and underneath the pillars of FIG. 8C in accordance with embodiments of the disclosure. As shown in FIG. 8D, an electrically-tunable material 828 fills the space underneath the coated copper pillars 818 and also the nano-gaps between the copper pillars 818. An optically transparent layer 830 is disposed over the electrically-tunable material 828. The optically transparent layer 830 may include a glass or a polymer.

Example 4

The disclosure also provides an alternative embodiment where the metallic optical metasurface is modified from that shown in FIG. 7D. In the alternative embodiment, the encapsulation layer can be spin coated or deposited over the coated copper pillars and the electrically-tunable material in the nano-gap.

Figure 9:
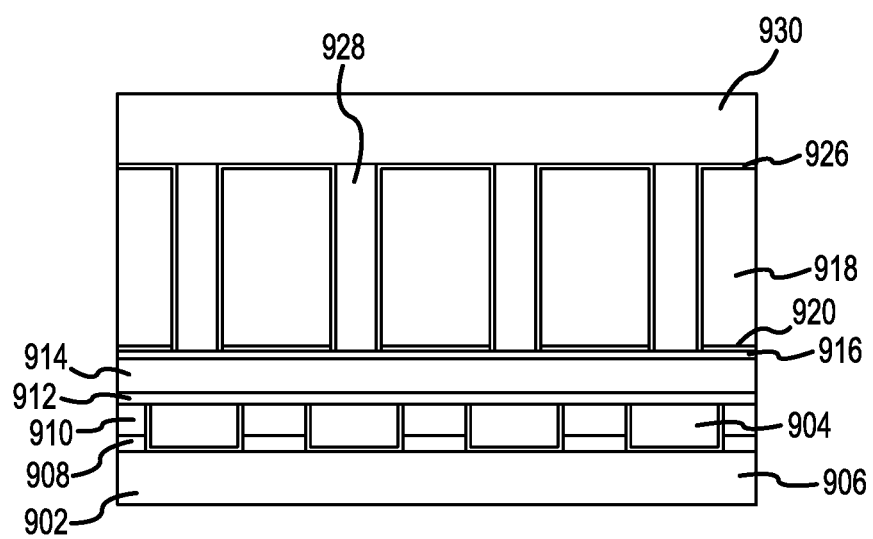
FIG. 9 shows a cross-sectional view of a modified structure from FIG. 7D in accordance with embodiments of the disclosure.

FIG. 9 shows a cross-sectional view of a modified structure from FIG. 7D in accordance with embodiments of the disclosure. As shown, a metallic optical metasurface includes an optically transparent layer 930 disposed over the copper pillars 918 and the electrically-tunable material 928 in the nano-gaps between the copper pillars 918. The optically transparent layer 930 may include a glass or a polymer. The top and the sidewalls of the copper pillars are coated with a dielectric coating layer 926. The bottom of the copper pillars 918 is protected by a conducting barrier layer 920 (e.g. Ta and/or TaN). The copper pillars 918 are disposed over a partial backplane structure including dielectric spacers 912, 914 and 916, and copper patches 904 embedded within dielectric layers 910 and 908. The sidewalls and the bottom of the copper patches 904 are protected with a conducting barrier layer 906 (e.g. Ta and/or TaN). The partial backplane structure is disposed over a wafer substrate 902. The wafer substrate may include a silicon wafer, among others.

As shown above in the Examples, a metallic optical metasurface can be formed. It will be appreciated by those skilled in the art that the above processes can be used for fabricating other metallic optical metasurfaces including full backplane structure, notch design backplane structure, or Bragg reflector backplane structure.

Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall in between.

What is claimed is:

1. A method for fabricating a metallic optical metasurface having an array of hologram elements, comprising:
   forming a first copper layer with a conducting or dielectric barrier layer over a backplane structure by a damascene process, wherein the first copper layer comprises a plurality of nano-gaps vertically extending from the backplane structure, wherein the plurality of nano-gaps is filled with a dielectric material, wherein the conducting or dielectric barrier layer is between the first copper layer and the backplane structure, and also between the first copper layer and the dielectric material;
   removing the dielectric material and a portion of the conducting or dielectric barrier layer to form exposed side portions in the nano-gaps of the first copper layer;
   depositing a dielectric coating layer over the top portion and the exposed side portions in the nano-gaps of the first copper layer to form protected nano-gaps of first copper layer; and
   filling the protected nano-gaps with an electrically-tunable dielectric material that has an electrically-tunable refractive index.

2. The method of claim 1, wherein the dielectric barrier layer or the dielectric coating layer comprises a material selected from a group consisting of SiN, SiC, SiCN, $Al_2O_3$, $HfO_2$, $SiO_2$, and optically transparent materials that are barriers to copper diffusion.

3. The method of claim 1, wherein the conducting barrier layer comprises one or more of tantalum, tantalum nitride, and a combination.

4. The method of claim 1, wherein the first copper layer comprises a plurality of copper pillars vertically extending from the backplane structure.

5. The method of claim 4, the step of removing the dielectric material further comprising:
   etching the dielectric material to form the nano-gaps between adjacent copper pillars by a chemical etchant at a first etching rate; and
   etching by the chemical etchant at a second etching rate to remove the portion of the conducting or dielectric barrier layer in the nano-gaps and the top portion of the first copper layer.

6. The method of claim 5, wherein the chemical etchant is a buffered oxide etchant.

7. The method of claim 1, wherein the electronically-tunable dielectric material is one of a liquid crystal material, electro-optic (EO) polymer material, or chalcogenide Glasses.

8. The method of claim 1, further comprising encapsulating the tunable dielectric material with an optically transparent material.

9. The method of claim 8, wherein the optically transparent material comprises a glass or a polymer.

10. The method of claim 1, further comprising removing the electrically-tunable dielectric material to expose the top portion of the protected first copper layer; and encapsulating the electrically-tunable dielectric material and the top portion of the protected first copper layer with an optically transparent material.

11. The method of claim 10, wherein the optically transparent material comprises a glass or a polymer.

12. The method of claim 1, further comprising forming the backplane structure over a substrate.

13. The method of claim 1, wherein the backplane structure comprises a dielectric spacer between the first copper layer and a second copper layer.

14. The method of claim 13, wherein the dielectric spacer comprises at least one thin chemically resistant layer and at least a thick low-k dielectric layer between the first copper layer and the second copper layer.

15. The method of claim 1, wherein the backplane structure is selected from a group consisting of a full backplane structure, a partial backplane structure, a notch backplane structure, and a Bragg reflector backplane structure.

16. The method of claim 15, wherein the partial backplane structure comprises a dielectric spacer between the first copper layer and a second copper layer having copper patches under each pair of adjacent copper pillars.

17. The method of claim 16, wherein the copper patches have a width equal to a pitch of a metallic hologram element in the full backplane structure.

18. The method of claim 15, wherein the notch backplane structure comprises a dielectric spacer having a notch between the first copper layer and a second copper layer, wherein the notch is under the gap between adjacent copper pillars.

19. The method of claim 15, wherein the Bragg reflector backplane structure comprises a plurality of dielectric layers having alternating first and second dielectric indexes.

20. The method of claim 1, wherein the dielectric material is selected from a group consisting of SiN, SiCN, SiC, $Al_2O_3$, $HfO_2$, and $SiO_2$.

21. A method for fabricating an optical metasurface, comprising:
   forming a plurality of copper pillars with a conducting barrier layer over a backplane structure by a damascene process, wherein a plurality of nano-gaps between the plurality of copper pillars is filled with a dielectric material, wherein the conducting barrier layer is between the plurality of copper pillars and the backplane structure, and also between the plurality of copper pillars and the dielectric material, wherein the backplane structure comprises a stack of dielectric layers;

removing the dielectric material in the nano-gaps, at least the top layer of the stack of the dielectric layers, and the conducting barrier layer to expose side portions in the nano-gaps and a bottom portion underneath the plurality of copper pillars;

depositing a dielectric coating layer over the top portion, the exposed side portions in the nano-gaps between the plurality of copper pillars, and the bottom portion to form protected copper pillars; and filling the nano-gaps and the space underneath the protected copper pillars with an electrically-tunable dielectric material that has an electrically-tunable refractive index.

22. The method of claim 21, wherein the dielectric coating layer comprises a material selected from a group consisting of SiN, SiC, SiCN, $Al_2O_3$, $HfO_2$, $SiO_2$, and optically transparent materials that are barriers to copper diffusion.

23. The method of claim 22, wherein the conducting barrier layer comprises Ta and/or TaN.

* * * * *